United States Patent [19]

Kosaka

[11] Patent Number: 5,293,393

[45] Date of Patent: Mar. 8, 1994

[54] VERTICAL-TO-SURFACE TRANSMISSION ELECTROPHOTONIC DEVICE

[75] Inventor: Hideo Kosaka, Tokyo, Japan

[73] Assignee: NEC Corporation, Tokyo, Japan

[21] Appl. No.: 44,372

[22] Filed: Apr. 6, 1993

[30] Foreign Application Priority Data

Apr. 10, 1992 [JP] Japan ................................ 4-90995

[51] Int. Cl.$^5$ ................................ H01S 3/19
[52] U.S. Cl. ............................ 372/45; 257/85; 372/99
[58] Field of Search .......................... 372/43-50, 372/99; 257/84, 85

[56] References Cited

U.S. PATENT DOCUMENTS

| 4,949,350 | 8/1990 | Jewell et al. | 372/45 |
| 4,995,048 | 2/1991 | Kuindersma et al. | 372/50 |
| 5,012,486 | 4/1991 | Luryi et al. | 372/45 |
| 5,031,188 | 7/1991 | Koch et al. | 372/50 |
| 5,229,627 | 7/1993 | Kosaka | 257/85 |

FOREIGN PATENT DOCUMENTS 4-101483 4/1992 Japan .

OTHER PUBLICATIONS

"Conference Record of Optical Computing", pp. 164-166, 1990, Jahns et al, Optical Interconnects Using Microlasers And Planar Optics.

Primary Examiner—John D. Lee
Attorney, Agent, or Firm—Laff, Whitesel Conte & Saret

[57] ABSTRACT

A vertical-to-surface transmission electrophotonic device in a structure having a first distributed Bragg reflector of a first conductivity type, a first spacer layer of the first conductivity type, an active layer, a second spacer layer of a second conductivity type opposite to the first conductivity type, and a second distributed Bragg reflector of the second conductivity type, all of which are formed on a substrate to constitute a cavity in a direction perpendicular to a formation surface, characterized in that one layer of said first distributed Bragg reflector is locally thickened to constitute a double cavity, and that a light-emitting portion of a single-cavity structure and a light-receiving portion of a double-cavity structure are formed on said single substrate.

2 Claims, 4 Drawing Sheets

VERTICAL CAVITY
TYPE VSTEP

VERTICAL-TO-SURFACE TRANSMISSION ELECTROPHOTONIC DEVICE

BACKGROUND OF THE INVENTION

1. Field of the Invention

The present invention relates to a vertical-to-surface transmission electrophotonic device and, more particularly to a vertical-to-surface transmission electrophotonic device used in massive and parallel optical transmission and optical information processing.

2. Description of the Prior Art

A vertical-to-surface transmission electrophotonic device performs light emission and light reception on the same structure (Japanese Patent Application Laid-Open No. Hei 4-101483).

FIG. 1 is a sectional view showing a vertical-to-surface transmission electrophotonic device of a vertical cavity type as an example of the conventional vertical-to-surface transmission electrophotonic device. A guide layer and a distributed Bragg reflector are formed on the upper and lower surfaces of a quantum well layer operated as a light-absorption/active layer. The vertical cavity type vertical-to-surface transmission electrophotonic device has a "pnpn" structure.

As shown in FIG. 2, in an optical integrated element described in CONFERENCE RECORD OF OPTICAL COMPUTING, PP. 164-166, 1990, a light-emitting portion (microlasers or $\mu$-lasers) and a light-receiving portion (detectors) are independently formed to optimize the characteristics of these portions.

This conventional vertical cavity type vertical-to-surface transmission electrophotonic device must have a high reflectance of the distributed Bragg reflector to obtain a high Q value during resonance because the threshold current value of laser emission is decreased. For this reason, when this element is used as a light-receiving element, a detector bandwidth becomes narrow, and durability (tolerance) against variations in lasing wavelength due to the non-uniform film thickness between elements and the increase in temperature is poor, resulting in inconvenience. Another optical integrated element having a structure in which light-emitting and light-receiving portions are separated from each other is also proposed, as shown in FIG. 5. It is difficult to form a conventional surface emission type laser and a light-receiving element on a single substrate due to their structural difference. Any practical device having both the surface emission type laser and the light-receiving element on the single substrate has not yet been proposed.

SUMMARY OF THE INVENTION

The present invention has been made in view of the above circumstances, and has for its object to form a surface emission laser element having a low lasing threshold and a light-receiving element having basically the same layer structure as that of the surface emission laser and having a wide detector bandwidth In order to achieve the above object, according to the first aspect of the present invention, there is provided a vertical-to-surface transmission electrophotonic device in a structure having a first distributed Bragg reflector of a first conductivity type, a first spacer layer of the first conductivity type, an active layer, a second spacer layer of a second conductivity type opposite to the first conductivity type, and a second distributed Bragg reflector of the second conductivity type, all of which are formed on a substrate to constitute a cavity in a direction perpendicular to a formation surface, wherein one layer of the first distributed Bragg reflector is locally thickened to constitute a double cavity, and a light-emitting portion of a single-cavity structure and a light-receiving portion of a double-cavity structure are formed on the single substrate.

In order to achieve the above object, according to the second aspect of the present invention, there is provided a vertical-to-surface transmission electrophotonic photonic device in a structure having a first distributed Bragg reflector of a first conductivity type, a first spacer layer of the first conductivity type, an acrsve layer, a second spacer layer of a second conductivity type opposite to the first conductivity type, a second distributed Bragg reflector of the second conductivity type, a third spacer layer of the second conductivity type, and a third distributed Bragg reflector of the second conductivity type, all of which are formed on a substrate to constitute a double cavity in a direction perpendicular to a formation surface, wherein the third spacer layer and the third distributed Bragg reflector are partially removed to constitute a single cavitY, and a light-receiving element of a double-cavity structure and a light-emitting element of a single-cavity structure are formed on the single substrate.

The principles of increasing the detector bandwidths of the light-receiving portions according to the first and second aspects of the present invention are common and will be described below.

When a plurality of cavities designed to resonate at the same frequency are connected through an appropriate barrier, the resonance frequency is separated into different frequencies. This phenomenon can be understood from an analogy in which a plurality of single quantum wells are combined to release regeneracy to form several levels and form mini-bands. The line widths of the separated resonance lines are determined by a reciprocal of the life time of photons enclosed in each cavity. The interval between the individual resonance wavelengths is determined by a reciprocal of a time in which a light-localized state in one cavity is changed to a light-localized state in another cavity. For this reason, when the number of DBR layers of the cavity is increased, the line width is decreased. The interval between the individual resonance frequencies is decreased when the cavity interval is increased. Based on this relationship, the number of layers of the entire DBR and the cavity interval can be optimally designed such that the light-absorbing spectrum becomes flat as much as possible.

The above and many other advantages, features and additional dbject of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Figure 3:
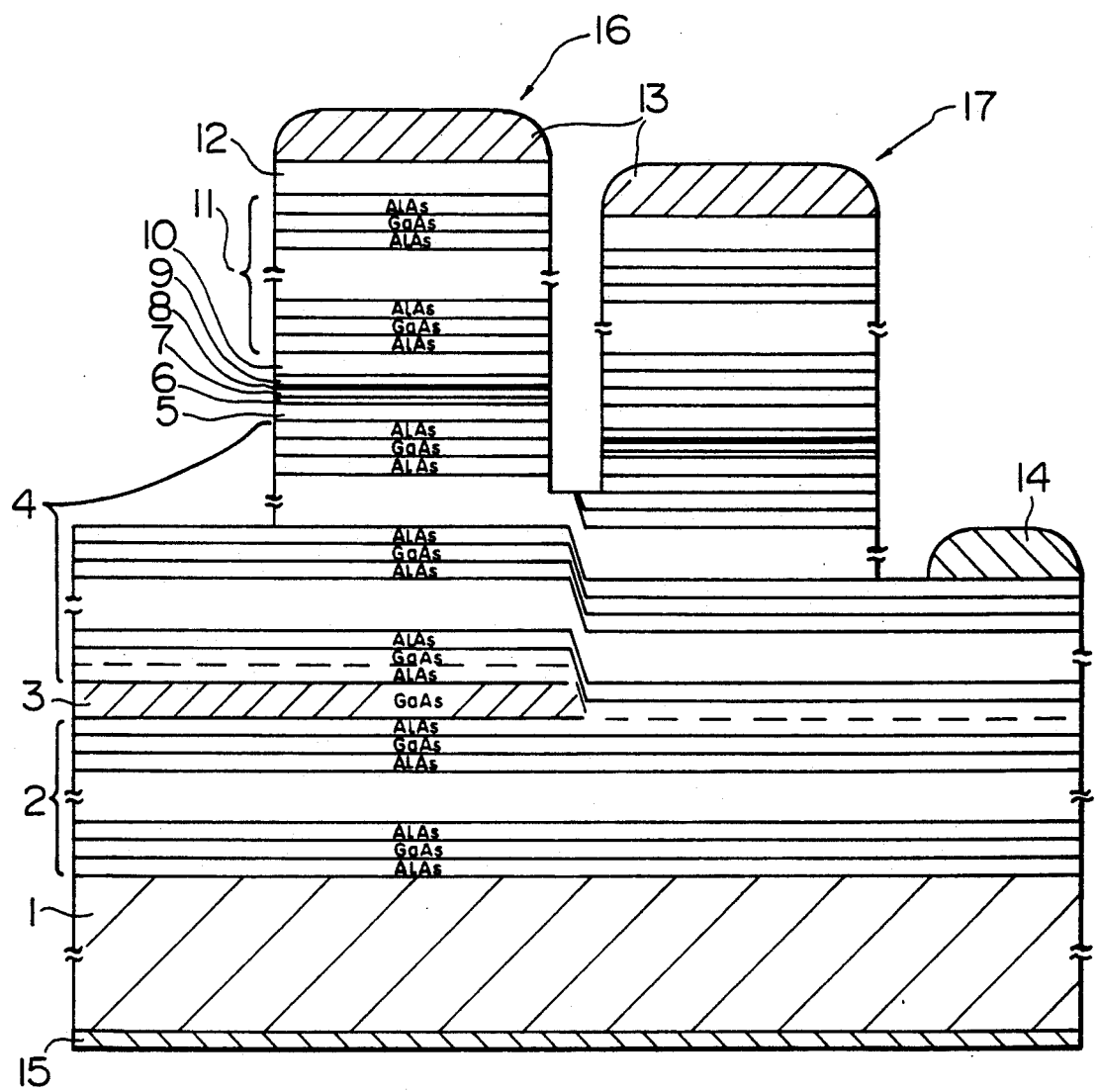
FIG. 3 is a sectional view of a structure for explaining a vertical-to-surface transmission electrophotonic device according to the first embodiment of the present invention.
Figure 4:
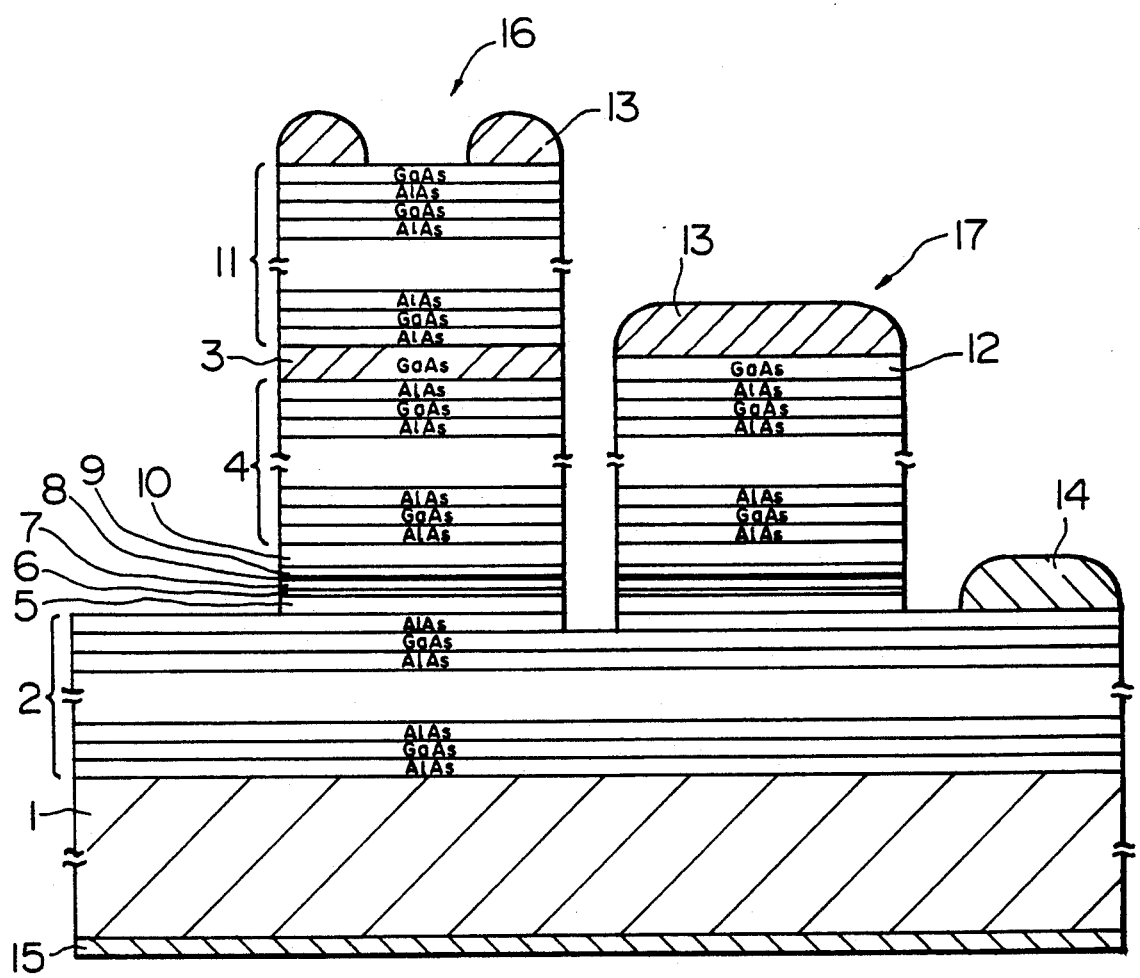
FIG. 4 is a sectional view of a structure for explaining a vertical-to-surface transmission electrophotonic device according to the second embodiment of the present invention.
Figure 5:
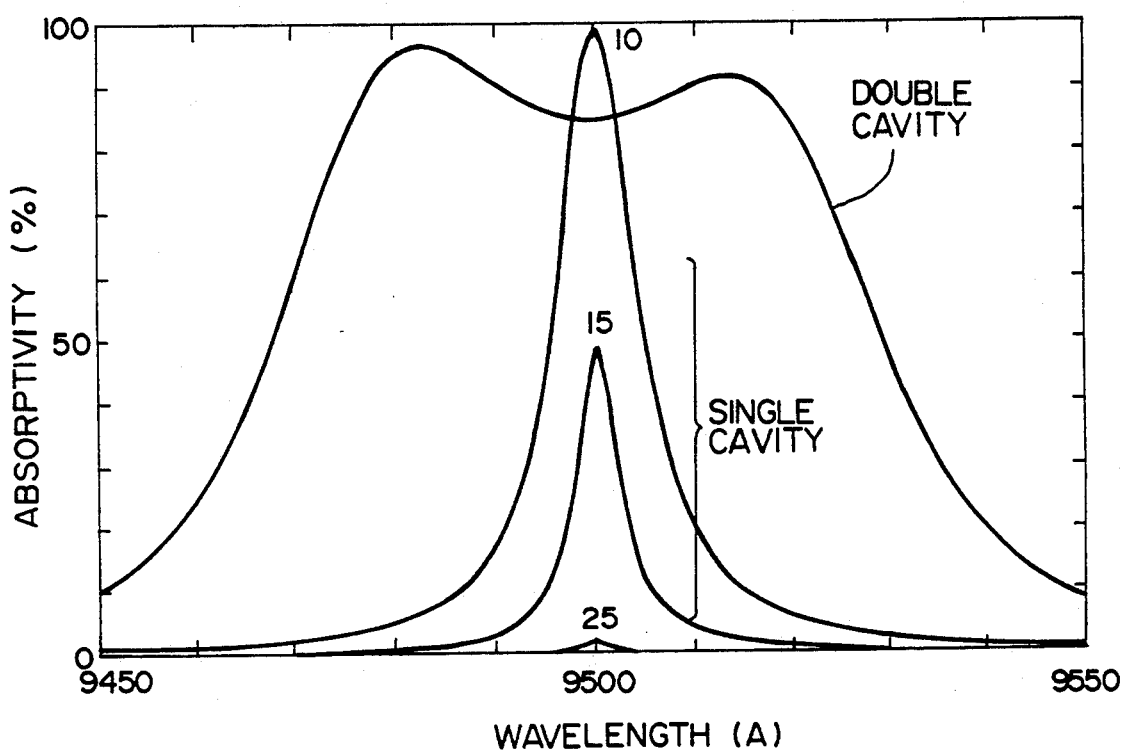
FIG. 5 is a light-absorbing spectrum showing an effect of light-receiving portions of the vertical-to-surface transmission electrophotonic devices of the first and second embodiments.

The present invention will be now described in detail with reference to several embodiments illustrated in the accompanying drawings (FIGS. 3 to 5). Each embodiment exemplifies a pnpn thyristor structure.

FIG. 3 is a sectional view showing a vertical-to-surface transmission electrophotonic device according to the first embodiment of the present invention.

Figure 1:
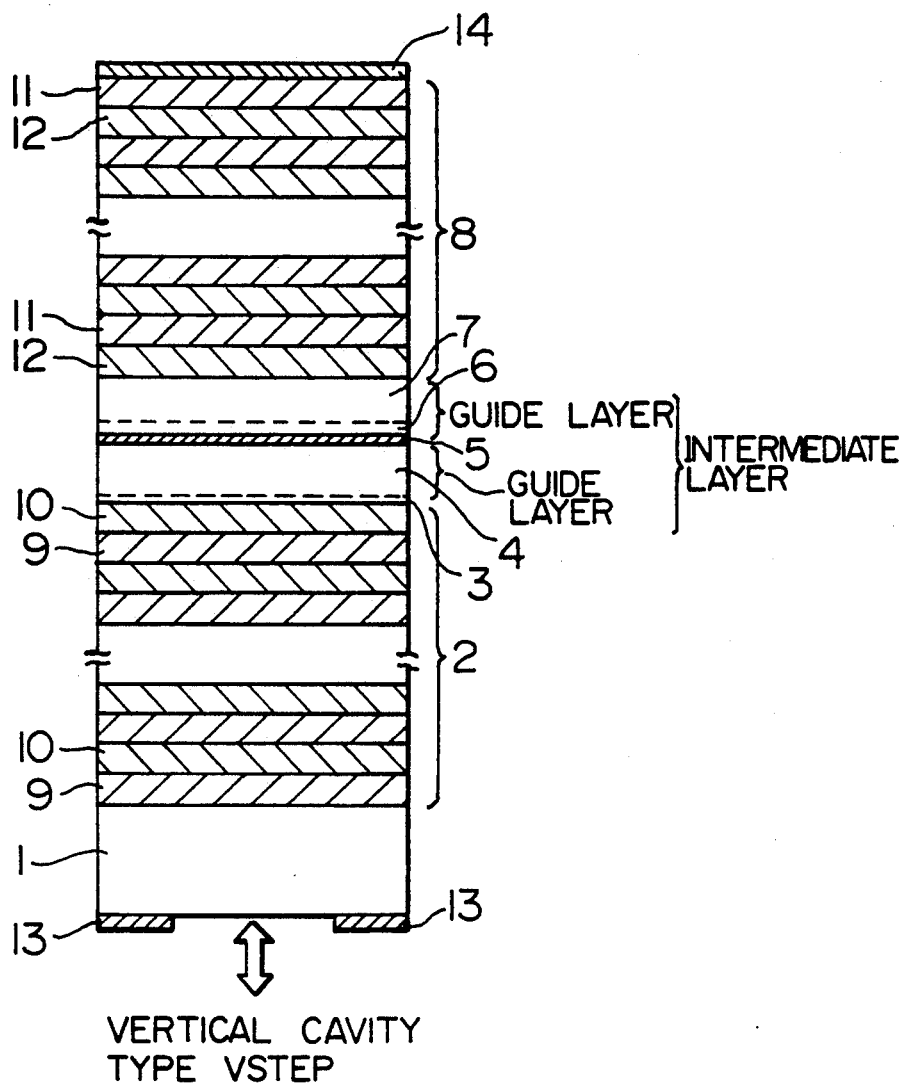
FIG. 1 is a sectional view of a structure for explaining a conventional vertical cavity type vertical-to-surface transmission electrophotonic device.
Figure 2:
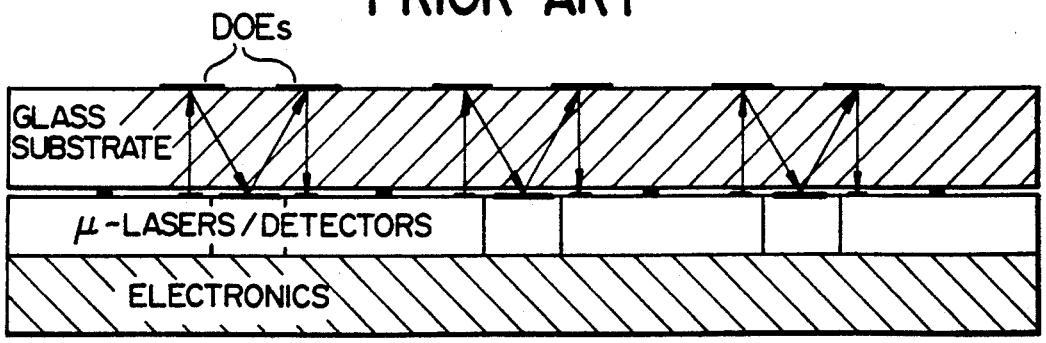
FIG. 2 is a sectional view of a structure for explaining a conventional optical integrated element.

An n-type distributed semiconductor layer (DBR1) formed by alternately forming n-GaAs (layer thickness: 515.4 Å; doping concentration: $2 \times 10^{18} cm^{-3}$) and n-AlAs (layer thickness: 649.4 Å; doping concentration: $2 \times 10^{18} cm^{-3}$), an n-GaAs spacer layer 3 (layer thickness: 1210.8 Å; doping concentration: $2 \times 10^{18} cm^{-3}$), n-AlAs (layer thickness: 649.4 Å; doping concentration: $2 \times 10^{18} cm^{-3}$), n-GaAs (layer thickness: 100Å; doping concentration: $2 \times 10^{18} cm^{-3}$; this layer is formed to clean the surface prior to regrowth and is not illustrated in FIG. 1 after the regrowth) are formed on a GaAs substrate 1 (insulating) by molecular beam epitaxy (MBE technique).

A resist is applied to only a light-receiving portion 16 to protect the surface, and n-GaAs, n-AlAs, and the n-GaAs spacer layer are etched from the uppermost layer of a light-emitting portion 17 so as to leave the last n-GaAs spacer layer by 100 Å.

After the resist is removed, the resultant structure is placed in the MBE chamber again and heated to remove n-GaAs left as the uppermost layer. An n-type distributed simiconductor layer (DBR2) 4 obtained by alternately formingn-GaAs (layer thickness: 515.4Å; doping concentration: $2 \times 10^{18} cm^{-3}$) and n-AlAs (layer thickness: 649.4Å; doping concentration: $2 \times 10^{18} cm^{-3}$), n-$Al_{0.4}Ga_{0.6}As$ 5 (layer thickness: 153.9 Å; doping concentration: $2 \times 10^{18} cm^{-3}$), p-$Al_{0.25}Ga_{0.75}As$ 6 (layer thickness 50 Å; doping concentration $1 \times 10^{19} cm^{-3}$), $Al_{0.25}Ga_{0.75}As$ 7 (layer thickness 1000 Å; undoped), a light-active/absorption layer 8 consisting of $In_{0.2}Ga_{0.8}As$ (layer thickness: 100Å; three-layered structure having sandwiched 100 Å thick undoped $Al_{0.25}Ga_{0.75}As$; undoped), $Al_{0.25}Ga_{0.75}As$ 9 (layer thickness: 900 Å; undoped), p-$Al_{0.45}Ga_{0.6}As$ 10 (layer thickness: 1548.7 Å; doping concentration: $5 \times 10^{18} cm^{-3}$), a p-type distributed semiconductor layer (DBR3) 11 obtained by alternately forming p-GaAs (layer thickness 515.4 Å; doping concentration: $3 \times 10^{18} cm^{-3}$) and p-AlAs (layer thickness: 633.7 Å; doping concentration: $3 \times 10^{18} cm^{-3}$), and a p-GaAs phase matching layer 12 (layer thickness: 1050.4 Å; doping concentration: $1 \times 10^{19} cm^{-3}$) are formed on the resultant structure.

A pseudo-grated structure consisting of GaAs and AlAs and having a film thickness gradually changed from 20 Å to 180 Å is formed at the boundary of the GaAs and AlAs layers of each distributed semiconductor layer so as to reduce the element resistance. The thickness of all the layers including the pseudo-grated structure is set to obtain a ratio as (designed resonance wavelength)/(effective refractive index)/4. The DBR1 has 7.5 pairs of layers, the DBR2 has 15.5 pairs of layers, and the DBR3 has 14.5 pairs of layers.

The light-receiving portion 16 and the light-emitting portion 17 are etched up to the n-type distributed semiconductor layer in a mesa shape. AuZi is deposited as a p-electrode 13 on the top of the etched surface, and AuGeNi is deposited as an n-electrode 14 on the substrate side. An antireflection coat 15 is formed on the lower surface of the substrate so as to suppress return light during light-receiving and light-emitting operations.

FIG. 4 is a sectional view of a structure according to the second embodiment of the present invention. An n-type distributed semiconductor layer (DBR1) 2 obtained by alternately forming n-GaAs (layer thickness: 515.4 Å; doping concentration: $2 \times 10^{18} cm^{-3}$) and n-AlAs (layer thickness: 649.4 Å; doping concentration: $2 \times 10^{18} cm^{-3}$), n-$Al_{0.4}Ga_{0.6}As$ 5 (layer thickness: 1553.9 Å; doping concentration: $2 \times 10^{18} cm^{-3}$), p-$Al_{0.25}Ga_{0.75}As$ 7 (layer thickness: 50 Å; doping concentration: $1 \times 10^{19} cm^{-3}$), $Al_{0.25}Ga_{0.75}As$ (layer thickness: 1000 Å; undoped), a light-active/absorption layer 8 consisting of $In_{0.2}Ga_{0.8}As$ (layer thickness: 100 Å; three-layered structure having sandwiched 100 Å thick undoped $Al_{0.25}Ga_{0.75}As$; undoped), $Al_{0.25}Ga_{0.75}As$ 9 (layer thickness: 900 Å; undoped), p-$Al_{0.45}Ga_{0.6}As$ 10 (layer thickness: 1548.7 Å; doping concentration: $5 \times 10^{18} cm^{-3}$), a p-type distributed semiconductor layer (DBR2) 4 obtained by alternately forming p-GaAs (layer thickness 515.4 Å; doping concentration: $3 \times 10^{18} cm^{-3}$) and p-AlAs (layer thickness 633.7 Å; doping concentration $3 \times 10^{18} cm^{-3}$), a p-GaAs spacer layer 3 (layer thickness 1210.8 Å; doping concentration: $3 \times 10^{18} cm^{-3}$), and a p-type distributed semiconductor layer (DBR3) 11 obtained by alternately forming p-GaAs (layer thickness: 515.4 Å; doping concentration: $3 \times 10^{18} cm^{-3}$) and p-AlAs (layer thickness: 633.7 Å; doping concentration $3 \times 10^{18} cm^{-3}$) are formed on a GaAs substrate 1 (insulating) by the MBE technique.

A super-lattice pseudo-grated structure consisting of GaAs and AlAs and having a layer thickness gradually changed from 20 Å to 180 Å is formed at the boundary of the GaAs and AlAs layers of each distributed semiconductor layer so as to reduce the element resistance. The thickness of each layer including the pseudo-grated structure is set to obtain a ratio as (designed resonance wavelength)/(effective refractive index)/4. The DBR1 has 24.5 pairs of layers, the DBR2 has 15.5 pairs of layers, and the DBR3 has 5 pairs of layers.

A resist is formed on onlY a light-receiving portion 16, and only a light-receiving portion 17 is etched up to the spacer layer. At this time, the spacer is left by 1,050 Å to obtain a phase correction layer. The light-receiving portion 16 and the light-emitting portion 17 are etched up to the n-type distributed semiconductor layer in a mesa shape. AuZi is deposited as a p-electrode 13 on the top of the etched surface, and AuGeNi is deposited as an n-electrode 14 on the substrate side. Note that a light-receiving window is formed in the light-receiving portion because light is received from the surface on which the distributed layer is formed. An antireflection coat 15 is formed on the lower surface of the substrate so as to suppress return light during light-receiving and light-emitting operations. If a light-emitting window is formed in the p-electrode of the light-emitting portion, both optical input and output operations can be performed from the MBE growth surface.

FIG. 5 shows the light-absorbing spectra of the light-receiving portions of the first and second embodiments. The single-cavity structure has the detector bandwidth of 2 to 10 Å (numbers 10, 15 and 25 represent the pair counts on the incident-side DBR). The light-receiving portion of each vertical-to-surface transmission electrophotonic device of the present invention has a double-cavity structure, so that the detector bandwidth is as large as about 60 Å at an absorptivity of 50% or more. This detector bandwidth has a light-receiving tolerance sufficiently large against variations in lasing wavelength caused by variations in layer thickness in distributed layer grown by the MBE technique, and variations in lasing wavelength caused by changes in temperature upon lasing. The light-absorbing layer thickness as small as 300 Å with respect to the thickness (about 1 μm) of the normal light-receiving element. Therefore, a high-speed response operation can be expected.

As has been described above, according to the present invention, by simply partially changing the layer structure using techniques for forming a vertical cavity type surface emission semiconductor laser, a surface emission laser element having a low lasing threshold and a light-receiving element having a wide detector bandwidth can be formed on a single substrate.

The above embodiments exemplify the GaAs system. However, the present invention is also applicable to another semiconductor material such as an InP system or a dielectric.

What is claimed is:

1. A vertical-to-surface transmission electrophotonic device in a structure having a first distributed Bragg reflector of a first conductivity type, a first spacer layer of the first conductivity type, an active layer, a second spacer layer of a second conductivity type opposite to the first conductivity type, and a second distributed Bragg reflector of the second conductivity type, all of which are formed on a substrate to constitute a cavity in a direction perpendicular to a formation surface, characterized in that one layer of said first distributed Bragg reflector is locally thickened to constitute a double cavity, and that a light-emitting portion of a single-cavity structure and a light-receiving portion of a double-cavity structure are formed on said single substrate.

2. A vertical-to-surface transmission electrophotonic device in a structure having a first distributed Bragg reflector of a first conductivity type, a first spacer layer of the first conductivity type, an active layer, a second spacer layer of a second conductivity type opposite to the first conductivity type, a second distributed Bragg reflector of the second conductivity type, a third spacer layer of the second conductivity type, and a third distributed Bragg reflector of the second conductivity type, all of which are formed on a substrate to constitute a double cavity in a direction perpendicular to a formation surface, characterized in that said third spacer layer and said third distributed Bragg reflector are partially removed to constitute a single cavity, and that a light-receiving element of a double-cavity structure and a light-emitting element of a single-cavity structure are formed on said single substrate.

* * * * *